United States Patent [19]
Okumura

[11] Patent Number: 5,869,996
[45] Date of Patent: Feb. 9, 1999

[54] SEMICONDUCTOR COMPOSITE ELEMENT, AND METHOD OF DETECTING ABNORMAL CONDITIONS IN AN INVERTER DEVICE HAVING THE ELEMENT

[75] Inventor: Norihiko Okumura, Aichi, Japan

[73] Assignee: Mitsubishi Denki Kabushiki Kaisha, Tokyo, Japan

[21] Appl. No.: 769,183

[22] Filed: Dec. 18, 1996

Related U.S. Application Data

[63] Continuation-in-part of Ser. No. 374,870, Jan. 19, 1995, abandoned.

[30] Foreign Application Priority Data

Sep. 20, 1994 [JP] Japan .................................. 6-224791

[51] Int. Cl.⁶ .................................................. H01L 35/00
[52] U.S. Cl. ......................... 327/512; 327/172; 327/268; 361/93; 340/825.16
[58] Field of Search .................................. 327/512, 513, 327/58, 78, 172, 174, 263, 268, 344; 307/117; 361/91, 96; 340/825.16

[56] References Cited

U.S. PATENT DOCUMENTS

| | | | |
|---|---|---|---|
| 3,646,398 | 2/1972 | Kotos | 361/102 |
| 4,052,659 | 10/1977 | Fletcher et al. | 363/57 |
| 4,572,143 | 2/1986 | Umesaki et al. | 123/479 |
| 4,845,483 | 7/1989 | Negishi | 340/825.16 |
| 4,931,751 | 6/1990 | Keller et al. | 332/108 |
| 5,426,390 | 6/1995 | Yabe et al. | 327/172 |

FOREIGN PATENT DOCUMENTS

| | | |
|---|---|---|
| A10250932 | 1/1988 | European Pat. Off. . |
| 57-84619 | 5/1982 | Japan .................... 327/172 |
| A2247118 | 2/1992 | United Kingdom . |
| A2264204 | 8/1993 | United Kingdom . |
| A2267190 | 11/1993 | United Kingdom . |

Primary Examiner—Kenneth B. Wells
Attorney, Agent, or Firm—Sughrue, Mion, Zinn, Macpeak & Seas, PLLC

[57] ABSTRACT

A semiconductor composite element in which abnormal conditions of overcurrent, control supply voltage reduction and overheat are detected, and different abnormality signals are outputted according to the respective abnormal conditions thus detected. The semiconductor composite element includes: abnormal condition detecting circuitry for detecting the overcurrent and control supply voltage reduction of any one or all of the plurality of semiconductor switching elements and the overheat of the semiconductor composite element. An abnormality signal generating circuit is provided for producing different abnormality signals according to the respective abnormal conditions detected by the abnormal condition detecting circuitry.

4 Claims, 7 Drawing Sheets

FIG. 3(a) ABNORMALITY SIGNAL AT OCCURRENCE OF OVERCURRENT ABNORMALITY (1ms)

FIG. 3(b) ABNORMALITY SIGNAL AT OCCURRENCE OF ABNORMALITY OF CONTROL SUPPLY VOLTAGE REDUCTION (2ms)

FIG. 3(c) ABNORMALITY SIGNAL AT OCCURRENCE OF OVERHEAT ABNORMALITY (3ms)

SEMICONDUCTOR COMPOSITE ELEMENT, AND METHOD OF DETECTING ABNORMAL CONDITIONS IN AN INVERTER DEVICE HAVING THE ELEMENT

This is a Continuation-In-Part of application Ser. No. 08/374,870 filed Jan. 19, 1995, now abandoned.

BACKGROUND OF THE INVENTION

1. Field of the Invention

This invention relates to a semiconductor composite element which is employed in equipment such as an inverter device, and in which abnormal conditions of overcurrent, control voltage reduction, and overheat are detected, and different abnormality signals are outputted according to the respective abnormal conditions thus detected, and to a method of detecting abnormal conditions in an inverter device having the semiconductor composite element.

2. Description of the Background Art

Figure 5:
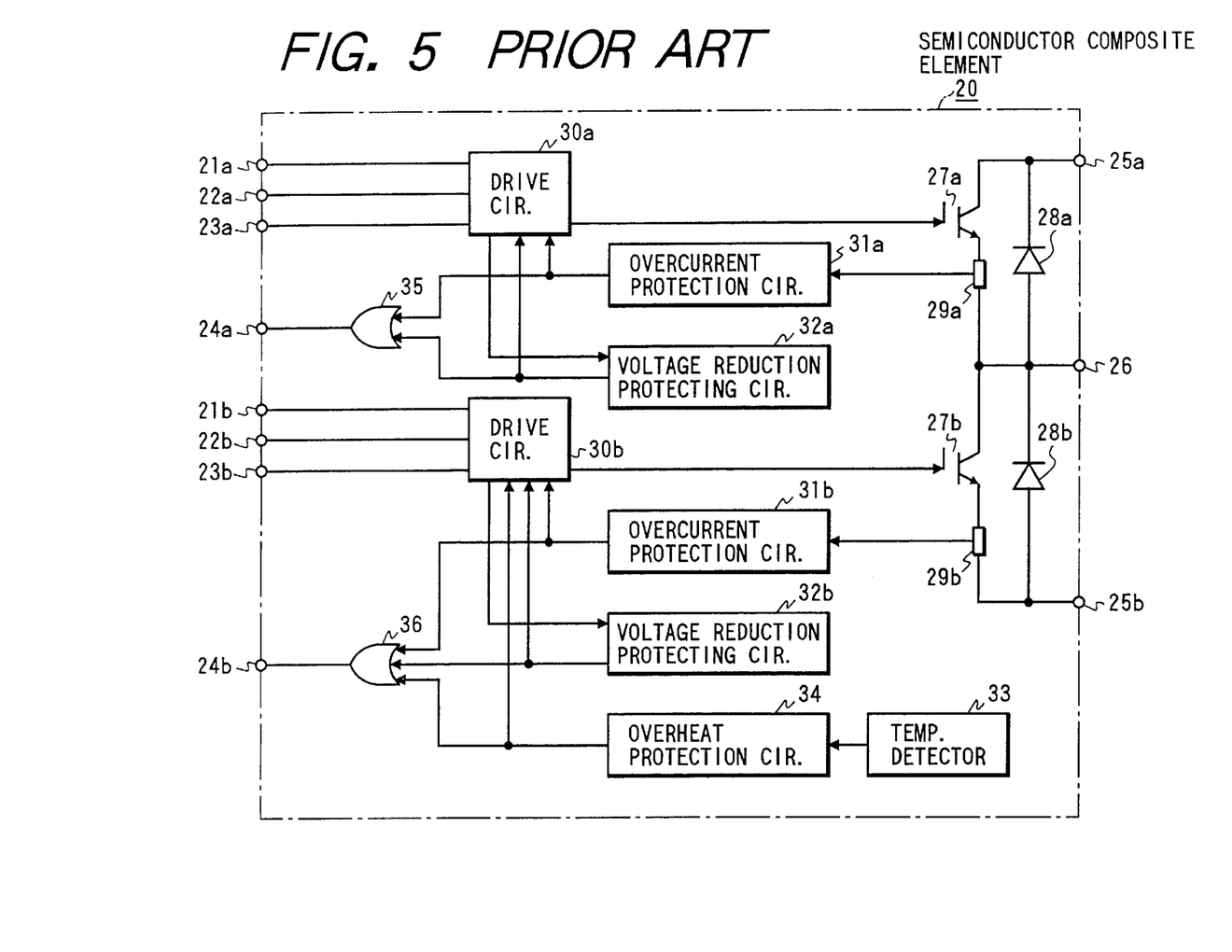
FIG. 5 is a block diagram showing the internal arrangement of a conventional semiconductor composite element.

FIG. 5 is a block diagram showing the internal arrangement of a conventional semiconductor composite element. In FIG. 5, reference symbol 20 designates the semiconductor composite element; 21a, a positive-side control power source terminal; 21b, a negative-side control power source terminal; 22a, a positive-side control common terminal; 22b, a negative-side control common terminal; 23a, a positive-side control signal input terminal; 23b, a negative-side control signal input terminal; 24a, a positive-side abnormality signal output terminal; 24b, a negative-side abnormality signal output terminal; 25a, a positive-side DC power input terminal; 25b, a negative-side DC power input terminal; 26, an AC power output terminal; 27a, a positive-side semiconductor switching element which is a transistor; and 27b, a negative-side semiconductor switching element which is also a transistor. Further in FIG. 5, reference symbol 28a denotes a positive-side diode; 28b, a negative-side diode; 29a, a positive-side transistor current detector; 29b, a negative-side transistor current detector; 30a, a positive-side transistor drive circuit; 30b, a negative-side transistor drive circuit; 31a, a positive-side transistor overcurrent protection circuit; 31b, a negative-side transistor overcurrent protection circuit; 32a, a positive-side control supply voltage reduction protecting circuit; 32b, a negative-side control supply voltage reduction protecting circuit; 33, a temperature detector for detecting a temperature of the semiconductor composite element 20; 34, an overheat protection circuit; 35, a first logical OR circuit which produces an output signal upon reception of any one of the output signals of the positive-side transistor overcurrent protection circuit 31a and of the positive-side control supply voltage protection circuit 32a; and 36, a second logical OR circuit which produces an output signal upon reception of any one of the output signals of the negative-side transistor overcurrent protection circuit 31b and of the negative-side control supply voltage protection circuit 32b.

In the conventional semiconductor composite element 20 thus organized, control signals which do not turn on the positive-side transistor 27a and the negative-side transistor 27b at the same time are applied to the positive-side and negative-side control signal input terminals 23a and 23b, respectively, so that the transistors 27a and 27b are alternately turned on and off through the positive-side transistor drive circuit 30a and the negative-side transistor drive circuit 30b, to provide AC power at the AC power output terminal 26 whereby AC current flows in the transistors.

In this operation, the currents flowing in the positive-side transistor 27a and the negative side transistor 27b are detected by the positive-side current detector 29a and the negative-side current detector 29b, respectively. The positive-side overcurrent protection circuit 31a and the negative-side overcurrent protection circuit 31b determine whether or not the currents thus detected are abnormal, i.e. larger than a predetermined value. When detecting an overcurrent abnormality, the positive-side overcurrent protection circuit 31a (or negative-side overcurrent protection circuit 31b) supplies an abnormality signal to the positive-side transistor drive circuit 30a (or negative-side transistor drive circuit 30b) connected thereto. Upon reception of the abnormality signal, the positive-side transistor drive circuit 30a (or negative-side transistor drive circuit 30b) turns off the positive-side transistor 27a (or negative-side transistor 27b) to cut off the current irrespective of the control signal applied to the positive-side (or negative-side) control signal input terminal 23a (or 23b). At the same time, the positive-side overcurrent protection circuit 31a (or negative-side overcurrent protection circuit 31b) supplies the abnormality signal through the first logical OR element 35 (or second logical OR element 36) to the positive-side abnormality signal output terminal 24a (or negative-side abnormality signal output terminal 24b.

On the other hand, a control supply voltage applied between the positive-side control power source terminal 21a and the positive-side control common terminal 22a, and a control supply voltage applied between the negative-side control power source terminal 21b and the negative-side control common terminal 22b are read by the positive-side control supply voltage reduction protecting circuit 32a and the negative-side control supply voltage reduction protecting circuit 32b, respectively, so that it is determined whether or not the control supply voltages are abnormal being smaller than a predetermined value. When an abnormality occurs involving a control supply voltage reduction, in a manner similar to the above-described overcurrent detection, the positive-side control supply voltage reduction protecting circuit 32a (or negative-side control supply voltage reduction protecting circuit 32b) supplies an abnormality signal to the positive-side transistor drive circuit 30a (or negative-side transistor drive circuit 30b). Upon reception of the abnormality signal, the positive-side transistor drive circuit 30a (or negative-side transistor drive circuit 30b) turns off the positive-side transistor 27a (or negative-side transistor 27b) to cut off the current irrespective of the control signal applied to the positive side (or negative side) control signal input terminal 23a (or 23b). At the same time, the positive-side control supply voltage reduction protecting circuit 32a (or negative-side control supply voltage reduction protecting circuit 32b) supplies the abnormality signal through the first logical OR element 35 (or second logical OR element 36) to the positive-side abnormality signal output terminal 24a (or negative-side abnormality signal output terminal 24b).

The temperature of the semiconductor composite element 20 is detected by the temperature detector 33. The overheat protection circuit 34 determines whether or not the temperature thus detected is abnormal, i.e., higher than a predetermined value. When detecting an overheat abnormality, the overheat protection circuit 34 supplies an abnormality signal to the negative-side transistor drive circuit 30b. Upon reception of the abnormality signal, the negative-side transistor drive circuit 30b turns off the negative-side transistor 27b to cut off the current irrespective of the control signal applied to the negative-side control signal input terminal 23b. At the same time, the overheat protection circuit 34 supplies the abnormality signal through the second logical OR element 36 to the negative-side abnormality signal output terminal 24b.

As was described above, in the conventional semiconductor composite element, in order to detect three abnormal conditions of overcurrent, control supply voltage reduction and overheat, the detected current, voltage and temperature are compared with the predetermined values, respectively, to determine whether or not they are abnormal; and when it is determined that any one of the current, voltage and temperature is abnormal, the abnormality signal is outputted to eliminate the abnormal condition. However, the semiconductor composite element involves a problem in that the particular abnormal condition cannot be identified from the abnormality signal thus outputted.

SUMMARY OF THE INVENTION

The present invention has been made to eliminate the above-described problem accompanying the conventional semiconductor composite element. Accordingly, an object of the invention is to provide a semiconductor composite element in which three abnormal conditions of overcurrent, control supply voltage reduction and overheat are detected, and different abnormality signals are provided as outputs according to the three respective abnormal conditions, to protect the apparatus concerned.

Another object of the invention is to provide a method of detecting abnormal conditions in an inverter device having such a semiconductor composite element.

The foregoing objects of the invention have been achieved by the provision of a semiconductor composite element which comprises:

abnormal condition detecting means for detecting overcurrent and control supply voltage reduction of any one or all of the plurality of semiconductor switching elements and for detecting overheat of the semiconductor composite element; and abnormality signal generating means for producing different abnormality signals according to the respective abnormal conditions detected by the abnormal condition detecting means.

The foregoing objects of the invention have been achieved by the provision of a semiconductor composite element which comprises:

a first abnormal condition detecting means for detecting overcurrent and control supply voltage reduction of a first semiconductor switching element;

a second abnormal condition detecting means for detecting overcurrent and control supply voltage reduction of a second semiconductor switching element, and for detecting overheat of the semiconductor composite element;

a first abnormality signal generating means for producing different abnormality signals according to the respective abnormal conditions detected by the first abnormal condition detecting means; and a second abnormality signal generating means for producing different abnormality signals according to the respective abnormal conditions detected by the second abnormal condition detecting means.

The foregoing object is also achieved by using a method of detecting abnormal conditions in an inverter device in which when overcurrent of any one or all of the plurality of semiconductor switching elements in a semiconductor composite element forming the inverter device is detected, a first abnormality signal corresponding thereto is provided as an output, when control supply voltage reduction of any one or all of the plurality of semiconductor switching elements is detected, a second abnormality signal corresponding thereto is provided as an output, and when overheat of the semiconductor composite element is detected, a third abnormality signal corresponding thereto is provided as an output.

PREFERRED EMBODIMENTS OF THE INVENTION

First Embodiment

Figure 1:
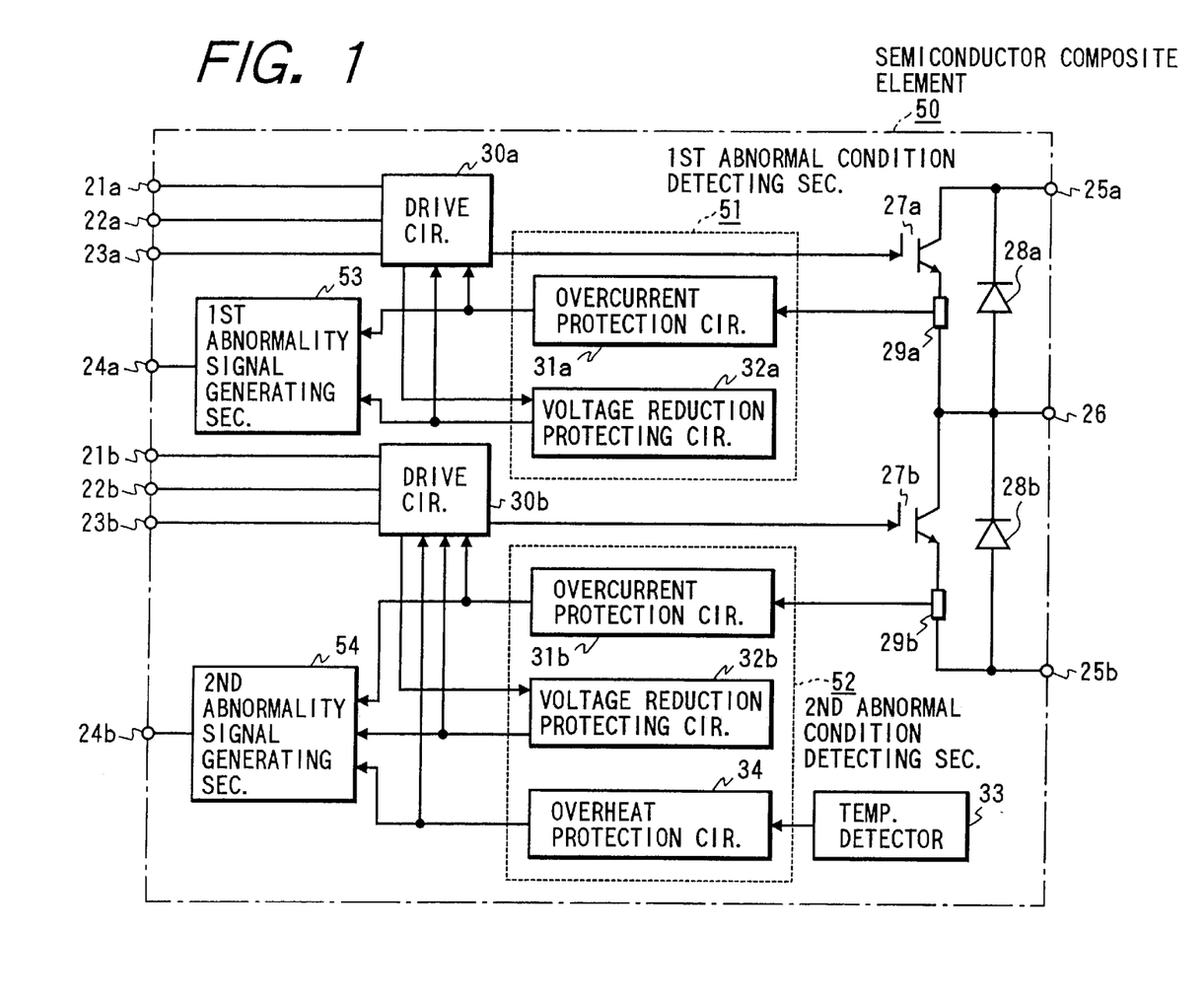
FIG. 1 is a block diagram showing the internal arrangement of a semiconductor composite element, which constitutes one embodiment of the invention.

FIG. 1 is a block diagram showing the internal arrangement of a semiconductor composite element, which constitutes a first embodiment of the invention. In FIG. 1, reference symbol 50 designates the semiconductor composite element; 51, a first abnormal condition detecting section comprising a positive-side overcurrent protection circuit 31a and a positive-side control supply voltage reduction protecting circuit 32a; 52, a second abnormal condition detecting section comprising a negative-side overcurrent protection circuit 31b, a negative-side control supply voltage reduction protecting circuit 32b, and an overheat protection circuit 34; 53, a first abnormality signal generating section which receives the output signals of the positive-side overcurrent protection circuit 31a and the positive-side control supply voltage reduction protecting circuit 32a to produce output signals as described later; and 54, a second abnormality signal generating section which is one of the specific features of the invention. The output signals of the positive-side overcurrent protection circuit 31a and the positive-side control supply voltage reduction protecting circuit 32a have substantially the same time duration, for example, 1 ms. The section 54 receives the output signals of the negative-side overcurrent protection circuit 31b, the negative-side control supply voltage reduction protecting circuit 32b, and the overheat protection circuit 34, to produce output signals as described later. The output signals of the negative-side overcurrent protection circuit 31b, the negative-side control supply voltage reduction protecting circuit 32b, and the overheat protection circuit 34 have substantially the same time duration, for example, 1 ms. The other components are the same as those in the conventional semiconductor composite element shown in FIG. 5, and descriptions therefor are omitted.

In the first embodiment, the overheat protection circuit 34 is a part of the second abnormal condition detecting section 52. However, it may be a part of the first abnormal condition detecting section 51 rather than the detecting section 52, or it may be included in both of the first and second abnormal condition detecting sections 51 and 52.

Figure 2:
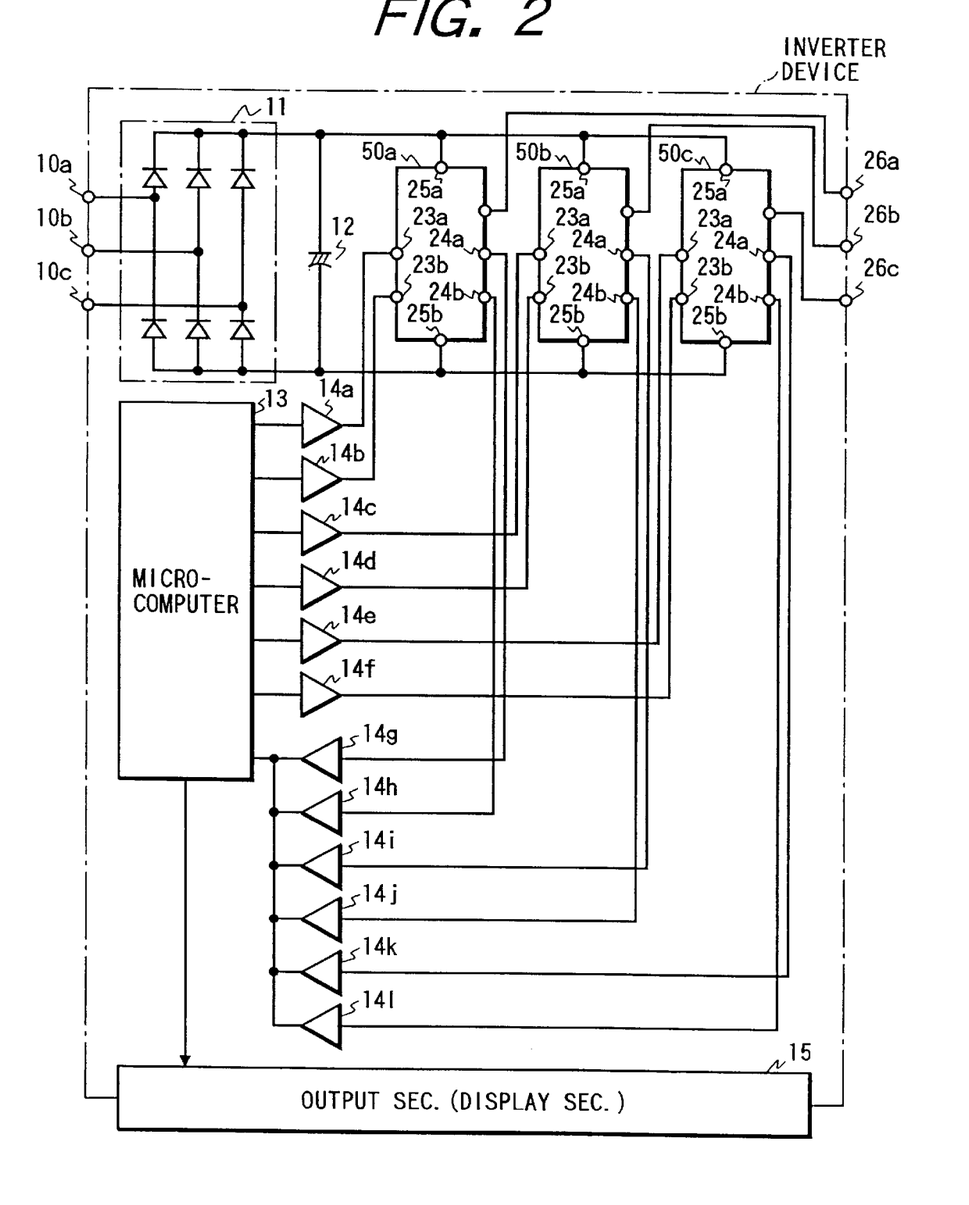
FIG. 2 is a block diagram showing the arrangement of an inverter device having the semiconductor composite elements according to the invention.

FIG. 2 is a block diagram showing the arrangement of an inverter device having the semiconductor composite elements according to the invention. In FIG. 2, reference symbols 10a, 10b and 10c designate power input terminals of the inverter device; 11, a diode bridge serving as a converter section; 12, a smoothing capacitor; 50a, 50b and 50c, the semiconductor composite elements shown in FIG. 1 in detail; 26a, 26b and 26c, AC power output terminal of the inverter device; 13, a microcomputer in the inverter device; 14a through 14l, isolated amplifiers; and 15, an output section, for instance, electrical terminals or a display section such as a LED monitor, for outputting the abnormality signals from the inverter device.

In the inverter device shown in FIG. 2, AC power applied to the power input terminals 10a through 10c is rectified by the diode bridge 11 and smoothed by the smoothing capacitor 12 into DC power. On the other hand, the microcomputer 13 supplies control signals through the isolated amplifiers 14a through 14f to the positive-side and negative-side control signal input terminals 23a and 23b of the three semiconductor composite elements 50a, 50b and 50c. As a result, in those semiconductor composite elements, six semiconductor switching elements (in this embodiment, transistors; not shown) are switched, so that the aforementioned DC power is converted into AC power having a desired frequency and a desired voltage. The AC power is outputted through the output terminals 26a, 26b and 26c.

In this operation, each of the semiconductor composite elements 50a, 50b and 50c operates as follows. The semiconductor composite elements 50a through 50c are each designed as shown in FIG. 1. Therefore, the positive-side and negative-side transistor drive circuits 30a and 30b switch the positive-side and negative-side transistors 27a and 27b according to the control signals applied to the positive-side and negative-side control signal input terminals 23a and 23b, respectively, as a result of which AC current is produced at the AC power output terminal 26.

Figure 3A:
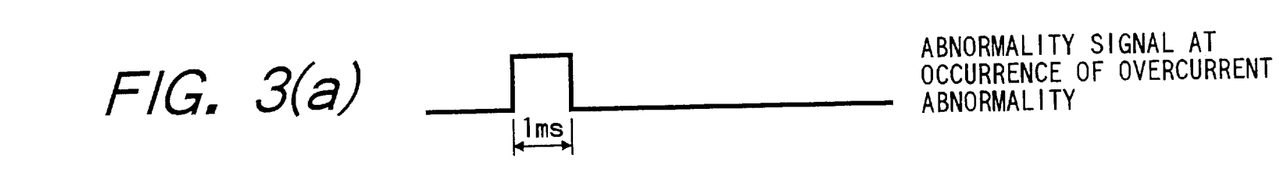
FIGS. 3(a)–3(c) are diagrams showing different abnormality signals produced at the abnormality signal output terminals of the semiconductor composite element when abnormal conditions occur therein.

The current flowing in the positive-side transistor 27a and the current flowing in the negative-side transistor 27b are detected by the positive-side current detector 29a and the negative-side current detector 29b, respectively. And the positive-side overcurrent protection circuit 31a and the negative-side overcurrent protection circuit 31b judge whether or not the currents thus detected are abnormal, i.e., are larger than a predetermined value. When detecting an abnormality, the positive-side overcurrent protection circuit 31a (or negative-side overcurrent protection circuit 31b) supplies an abnormality signal to the positive-side transistor drive circuit 30a (or negative-side transistor drive circuit 30b). Upon reception of the abnormality signal, the positive-side transistor drive circuit 30a (or negative-side transistor drive circuit 30b) turns off the positive-side transistor 27a (or negative-side transistor 27b) to cut off the current irrespective of the control signal applied to the positive-side (or negative-side) control signal input terminal 23a (or 23b), to thereby effect protection from the overcurrent. At the same time, the positive-side overcurrent protection circuit 31a (or negative-side overcurrent protection circuit 31b) supplies the abnormality signal to the first abnormal signal generating section, namely, the positive-side abnormality signal generating circuit 53 (or second abnormal signal generating section, namely, the negative-side abnormality signal generating circuit 54). At circuits 53 or 54, a pulse signal having a pulse (on) width of 1 ms as shown in FIG. 3(a) is produced as a signal indicating overcurrent abnormality. The pulse signal is supplied to the positive-side abnormality signal output terminal 24a (or negative-side abnormality signal output terminal 24b).

On the other hand, a control supply voltage applied between the positive-side control power source terminal 21a and the positive-side control common terminal 22a, and a control supply voltage applied between the negative-side control power source terminal 21b and the negative-side control common terminal 22b are read by the positive-side control supply voltage reduction protecting circuit 32a and the negative-side control supply voltage reduction protecting circuit 32b, respectively. As a result, it is determined whether or not the control supply voltages are abnormal, i.e., are smaller than a predetermined value. When the positive-side control supply voltage reduction protecting circuit 32a (or negative-side control supply voltage reduction protecting circuit 32b) judges that the control supply voltage is abnormal, similarly as in the case of the above-described overcurrent abnormality, the positive-side control supply voltage reduction protecting circuit 32a (or negative-side control supply voltage reduction protecting circuit 32b) supplies an abnormality signal to the positive-side transistor drive circuit 30a (or negative-side transistor drive circuit 30b). Upon reception of the abnormality signal, the positive-side transistor drive circuit 30a (or negative-side transistor drive circuit 30b) turns off the positive-side transistor 27a (or negative-side transistor 27b) to cut off the current irrespective of the control signal applied to the positive-side (or negative-side) control signal input side 23a (or 23b), to thereby effect protection from the control supply voltage reduction.

Figure 3B:
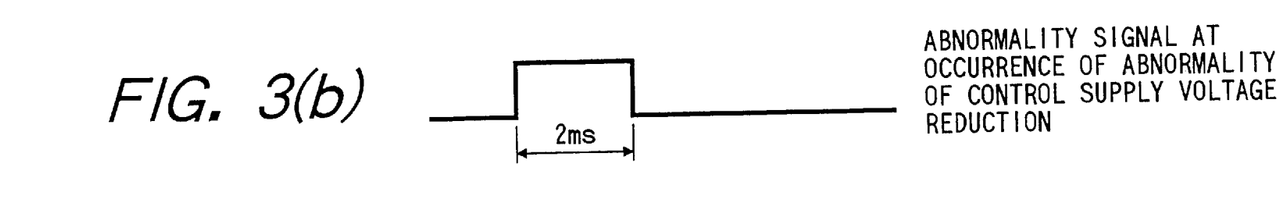

At the same time, the positive-side control supply voltage reduction protecting circuit 32a (or negative-side control supply voltage reduction protecting circuit 32b) supplies the abnormality signal to the positive-side abnormality signal generating circuit 53 (or negative-side abnormality signal generating circuit 54). At circuit 53 or 54, a pulse signal having a pulse (on) width of 2 ms as shown in FIG. 3(b) is produced as a signal indicating control supply voltage reduction. The pulse signal is supplied to the positive-side abnormality signal output terminal 24a (or negative-side abnormality signal output terminal 24b).

The temperature of each semiconductor composite element 50 is detected by the temperature detector 33. The overheat protection circuit 34 determines whether or not the temperature thus detected is abnormal, i.e., is higher than a predetermined value. When it is determined that the temperature is abnormal, the overheat protection circuit 34 supplies an abnormality signal to the negative-side transistor drive circuit 30b. In response to the abnormality signal, the negative-side transistor drive circuit 30b turns off the negative-side transistor 27b to cut off the current irrespective of the control signal applied to the negative-side control signal input terminal 23b, to thereby effect protection from the overheat.

Figure 3C:
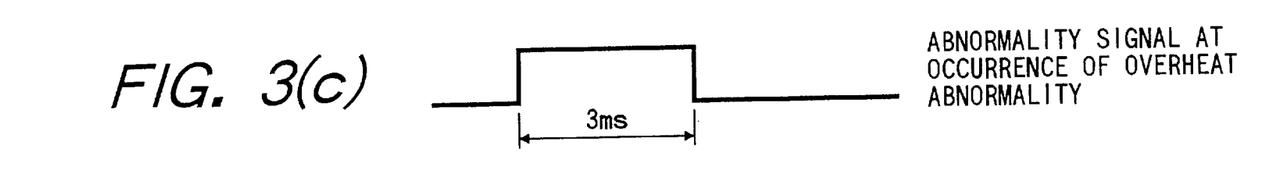

At the same time, the overheat protection circuit 34 supplies the abnormality signal to the negative-side abnormality signal generating circuit 54. The circuit outputs a pulse signal having a pulse (on) width of 3 ms, as shown in FIG. 3(c). This signal indicating an overheat abnormality, which is supplied to the negative-side abnormality signal output terminal 24b.

Figure 6:
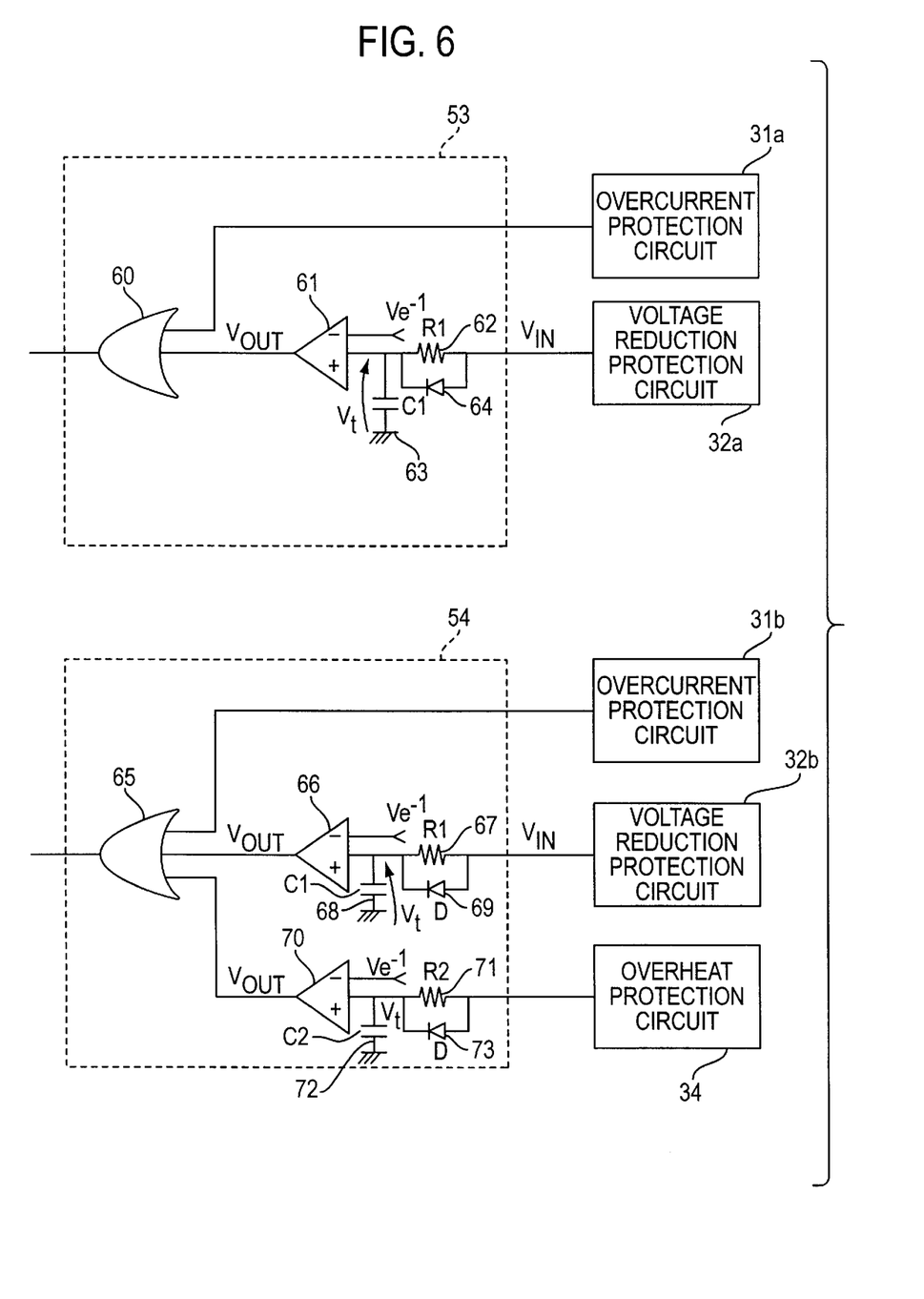
FIG. 6 is a diagram showing the internal arrangement of first and second abnormality signal generating sections.

The internal structure of the positive-side abnormality signal generating circuit 53 and the negative-side abnormality signal generating circuit 54 is shown in FIG. 6. The output signal of the positive-side overcurrent protection circuit 31a is connected directly to an input terminal of OR gate 60. When positive-side overcurrent protection circuit 31a produces a 1 ms pulse signal indicating an overcurrent abnormality, a 1 ms pulse signal is supplied to the positive-side abnormality signal output terminal 24a from the output terminal of OR gate 60.

The output signal of the positive-side control supply voltage reduction protecting circuit 32a is supplied to an elongating circuit comprising comparator 61, resistor 62 having resistance R1, capacitor 63 having capacitance C1 and diode 64. Resistor 62 and diode 64 are arranged in parallel in the path connecting a first input of the comparator 61 to the output of the positive-side control supply voltage reduction protecting circuit 32a. Capacitor 63 is connected between the first input of the comparator 61 and ground. A constant voltage $Ve^{-1}$ is applied to the second input of the comparator 61. Resistance R1 and capacitance C1 are set such that the product R1·C1 (the RC time constant) produces a 2 ms pulse signal at the output of comparator 61 when a 1 ms pulse signal is received from the output of the positive-side control supply voltage reduction protecting circuit 32a.

Figure 7A:
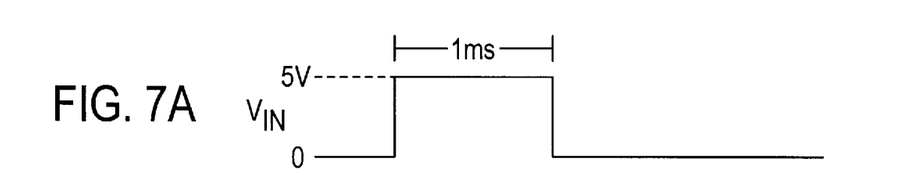
FIGS. 7A–7C are timing diagrams showing the relationship between voltages $V_{IN}$, $V_+$ and $V_{OUT}$ shown in FIG. 6.
Figure 7B:
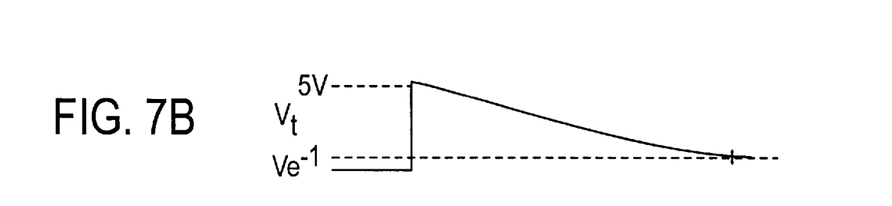
Figure 7C:
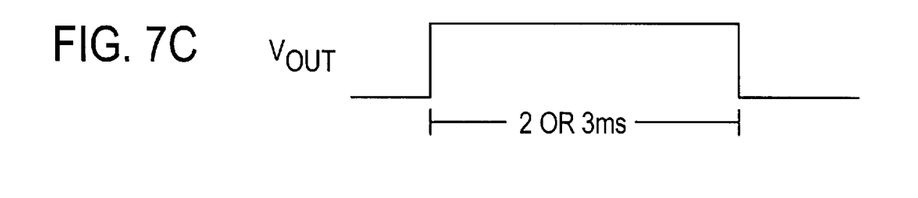

Specifically, as shown in FIGS. 7A–7C, when the 1 ms pulse signal $V_{IN}$ is received from the output of the positive-side control supply voltage reduction protecting circuit 32a, the voltage $V_+$ across the capacitor C1 (which is the voltage received at the input of the comparator) becomes 5 volts. Since voltage $V_+$ exceeds the voltage $Ve^{-1}$ at the second input of the comparator 61, the output of the comparator 61 is switched to the on state ($V_{OUT}$=5 volts). The voltage $V_+$ decays at a rate determined by the RC time constant (i.e, the slope of the curve in FIG. 7B is determined by the RC time constant). When the voltage $V_+$ falls below the voltage $Ve^{-1}$ at the second input of the comparator, the output of the comparator is switched to the off state ($V_{OUT}$=0 volts). Thus, by setting the RC time constant to an appropriate value relative to $Ve^{-1}$, a signal of 2 ms is produced from a signal having a pulse width of 1 ms.

The output of comparator 61 is supplied to an input terminal of OR gate 60, and a 2 ms pulse signal is supplied to the positive-side abnormality signal output terminal 24a from the output terminal of OR gate 60.

The output signal of the negative-side overcurrent protection circuit 31b is connected directly to an input terminal of OR gate 65 in negative-side abnormality signal generating circuit 54. When negative-side overcurrent protection circuit 31b produces a 1 ms pulse signal indicating an overcurrent abnormality, a 1 ms pulse signal is supplied to the negative-side abnormality signal output terminal 24b from the output terminal of OR gate 65.

The output signal of the negative-side control supply voltage reduction protecting circuit 32b is supplied to an elongating circuit comprising comparator 66, resistor 67 having resistance R1, capacitor 68 having capacitance C1 and diode 69. Resistor 67 and diode 69 are arranged in parallel in the path connecting one input of the comparator 66 to the output of the negative-side control supply voltage reduction protecting circuit 32b. Capacitor 68 is connected between the same input of the comparator 66 and ground. Resistance R1 and capacitance C1 are set such that the product R1·C1 produces a 2 ms pulse signal at the output of comparator 66 when a 1 ms pulse signal is received from the output of the negative-side control supply voltage reduction protecting circuit 32b in the manner explained above. The output of comparator 66 is supplied to an input terminal of OR gate 65, and a 2 ms pulse signal is supplied to the negative-side abnormality signal output terminal 24b from the output terminal of OR gate 65.

The output signal of the overheat protection circuit 34 is supplied to an elongating circuit comprising comparator 70, resistor 71 having resistance R2, capacitor 72 having capacitance C2 and diode 73. Resistor 71 and diode 73 are arranged in parallel in the path connecting one input of the comparator 70 to the output of the overheat protection circuit 34. Capacitor 72 is connected between the same input of the comparator 70 and ground. Resistance R2 and capacitance C2 are set such that the product R2·C2 produces a 3 ms pulse signal at the output of comparator 70 when a 1 ms pulse signal is received from the output of the overheat protection circuit 34 in the manner explained above. The output of comparator 70 is supplied to an input terminal of OR gate 65, and a 3 ms pulse signal is supplied to the negative-side abnormality signal output terminal 24b from the output terminal of OR gate 65.

The positive-side and negative-side abnormality signal output terminals 24a and 24b of the semiconductor composite elements 50a, 50b and 50c are connected through the isolated amplifiers 14g through 14l to the microcomputer 13 of the inverter device. Therefore, upon reception of the abnormality signal from the semiconductor composite elements 50a through 50c, the microcomputer 13 operates to protect the inverter device by suspending the outputting of the control signals which would otherwise be supplied through the isolated amplifiers 14a through 14f to the positive-side and negative-side control signal input terminals 23a and 23b of the three semiconductor composite elements 50a through 50c to switch the positive-side and negative-side transistors 27a and 27b.

At the same time, the microcomputer 3 identifies the abnormal condition from the abnormality signal. For instance, as seen in FIG. 3a, the overcurrent abnormality is identified from the pulse signal having a pulse (on) width of 1 ms. Also, as seen in FIG. 3b, the undercurrent abnormality is identified from the pulse (on) width of 2 ms. The overhead condition already has been described for signal 3C. The content of the abnormality thus identified is transmitted to the output section 15, so that it is outputted from the inverter device by means of the output section 15 that is electrical terminals or a display section such as a LED monitor.

Figure 4:
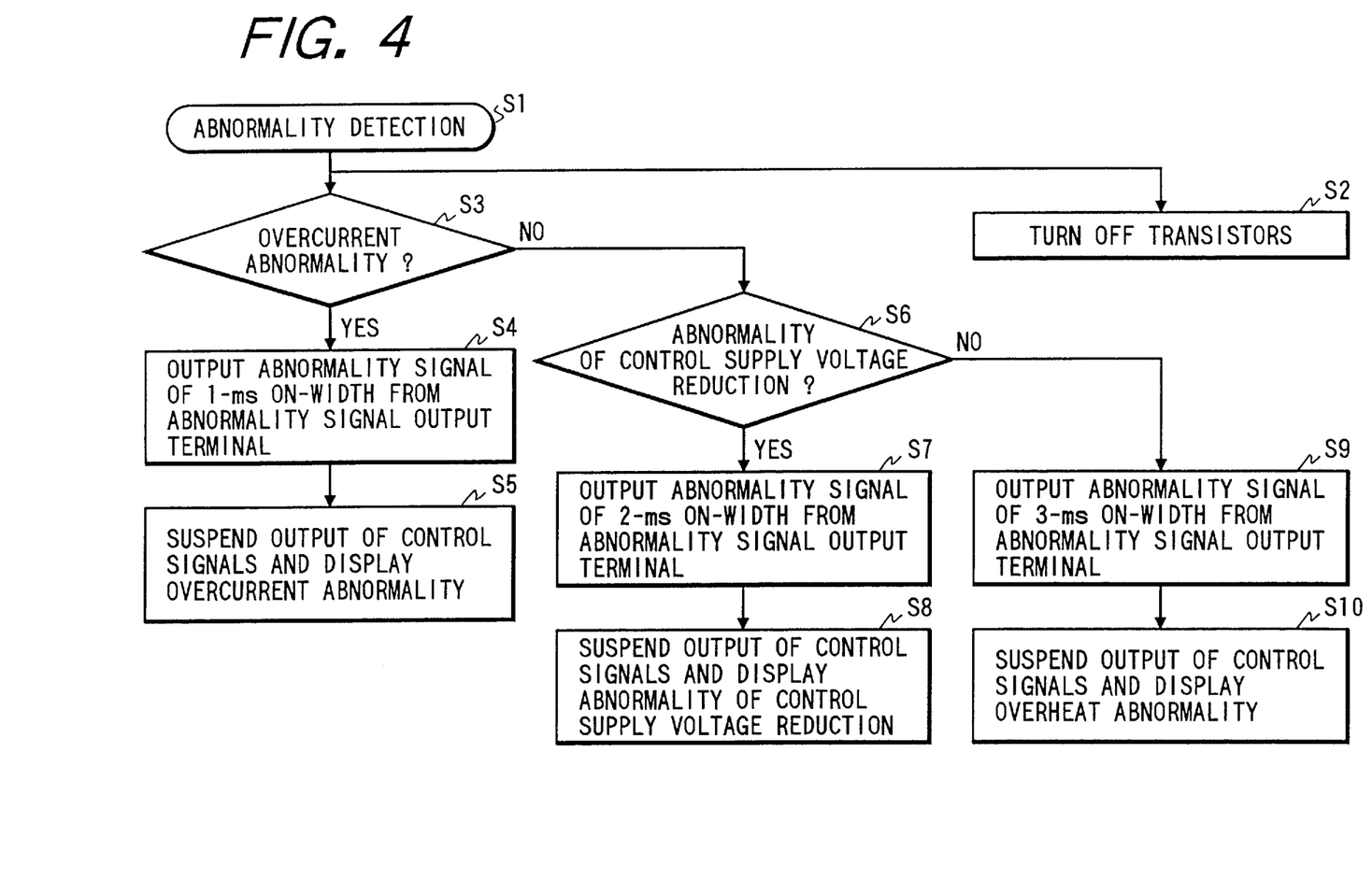
FIG. 4 is a flow chart for a description of the operation of an abnormality signal generating section, which is most characteristic of the invention.

Referring to FIG. 4, the above operation is further described for the case of the abnormal condition detection by the second abnormality signal generating section, namely, the negative-side abnormality signal generating circuit 54. When the negative-side abnormality signal generating circuit 54 detects an abnormal condition (S1), the positive-side and negative-side transistors 27a and 27b in each of the semiconductor composite elements 50a, 50b and 50c are turned off (S2). Next, it is judged whether or not the abnormal condition detected is overcurrent (S3). When it is judged that the abnormal condition detected is overcurrent, the abnormality signal, which is the pulse signal having a pulse (on) width of 1 ms, is supplied to the abnormality signal output terminal 24b (S4). In response to the abnormality signal outputted from the abnormality signal output terminal 24b, the supply of the control signals to the positive-side and negative side control signal input terminals 23a and 23b from the microcomputer 13 is suspended, to thereby stop the operations of the positive-side and negative side transistors 27a and 27b, while the overcurrent abnormality is displayed on the display section (S5).

When the abnormal condition detected is not overcurrent, then it is judged whether or not it is control supply voltage reduction (S6). When it is judged that the abnormal condition is control supply voltage reduction, the abnormality signal, which is the pulse signal having a pulse (on) width of 2 ms, is applied to the abnormality signal output terminal 24b (S7). In response to the abnormality signal outputted from the abnormality signal output terminal 24b, the supply of the control signals to the positive-side and negative side control signal input terminals 23a and 23b from the microcomputer 13 is suspended, thereby to stop the operations of the positive-side and negative side transistors 27a and 27b, while the control supply voltage reduction abnormality is displayed on the display section (S8).

When the abnormal condition detected is not control supply voltage reduction, then it should be overheat. Therefore, the abnormality signal, which is the pulse signal having a pulse (on) width of 3 ms, is supplied to the negative-side abnormality signal output terminal 24b (S9). In response to the abnormality signal outputted from the abnormality signal output terminal 24b, the supply of the control signals to the positive-side and negative side control signal input terminals 23a and 23b from the microcomputer 13 is suspended, to thereby stop the operations of the positive-side and negative side transistors 27a and 27b, while the overheat abnormality is displayed on the display section (S10). The negative-side abnormality signal generating circuit 54 operates in the above-described manner.

Second Embodiment

In the above-described first embodiment, for the overcurrent abnormality, the pulse signal having a pulse (on) width of 1 ms is outputted as the abnormality signal; for the control supply voltage reduction abnormality, the pulse signal having a pulse (on) width of 2 ms is outputted as the abnormality signal; and for the overheat abnormality, the pulse signal having a pulse (on) width of 3 ms is outputted as the abnormality signal. However, the invention is not limited thereto or thereby. That is, any signals which are distinguished from one another to indicate the respective abnormal conditions, as by different amplitudes, frequencies, phases or the like may be employed as the abnormality signals.

Furthermore, although in the above-described first embodiment, one abnormality signal output terminal is provided per transistor, the invention is not limited thereto or thereby. A plurality of abnormality signal output terminals may be provided so that the abnormality signals are distinguished from one another by a certain number of bits.

Moreover, although in the above-described first embodiment the semiconductor composite element has two transistors, the number of transistors is not limited thereto.

In summary, since the abnormality signal generating means produces different abnormality signals according to the respective abnormal conditions of overcurrent, control supply voltage reduction and overheat, the abnormal conditions in the semiconductor composite element can be identified accurately therefrom, so that the abnormal conditions can be eliminated quickly.

Also, in the semiconductor composite element, the first and second abnormality signal generating means produce different abnormality signals according to the respective abnormal conditions of overcurrent, control supply voltage reduction and overheat, which makes it possible to identify and deal with the abnormal conditions more quickly.

In the method of detecting abnormal conditions in an inverter device according to the invention, claim 3, when the overcurrent of the abnormal conditions in the inverter device can be accurately identified and quickly dealt with, which prevents or minimizes the adverse effects thereof on the apparatus concerned.

What is claimed is:

1. A semiconductor composite element having a plurality of semiconductor switching elements for controlling an inverter, comprising:

abnormal condition detecting means for detecting overcurrent and control supply voltage reduction in any one or all of said plurality of semiconductor switching elements and overheating of said semiconductor composite element; and abnormality signal generating means for producing different abnormality signals according to respective abnormal conditions detected by said abnormal condition detecting means, wherein each of said different abnormality signals is a single pulse and has a different time duration corresponding to a respective abnormal condition, said different abnormality signals being generated from detection signals sent from the abnormal condition detecting means, each of the detection signals having substantially the same time duration; wherein said abnormality signal generating means comprises:

a first elongating circuit connected to receive one of said detection signals and which produces a first signal having a time duration which is greater than the time duration of said one of said detection signals;

a second elongating circuit connected to receive another of said detection signals and which produces a second signal having a time duration which is greater than the time duration of said first signal; and an OR gate connected to receive the first and second signals and providing at an output said different abnormality signals.

2. The semiconductor composite element according to claim 1, wherein said first elongating circuit comprises a first resistor having a resistance R1 and a first capacitor having a capacitance C1, the first resistor and first capacitor being connected such that the time duration of said first signal is a function of the product R1·C1, and wherein said second elongating circuit comprises a second resistor having a resistance R2 and a second capacitor having a capacitance C2, the second resistor and second capacitor being connected such that the time duration of said second signal is a function of the product R2·C2.

3. A semiconductor composite element having at least a first semiconductor switching element and a second semiconductor switching element, for controlling an inverter, comprising:

a first abnormal condition detecting means for detecting overcurrent and control supply voltage reduction in said first semiconductor switching element;

a second abnormal condition detecting means for detecting overcurrent and control supply voltage reduction in said semiconductor switching element, and overheating of said semiconductor composite element;

a first abnormality signal generating means for producing different abnormality signals according to respective abnormal conditions detected by said first abnormal condition detecting means; and a second abnormality signal generating means for producing different abnormality signals according to respective abnormal conditions detected by said second abnormal condition detecting means, wherein each of said different abnormality signals produced by said first and second abnormality signal generating means is a single pulse and has a different time duration corresponding to a respective abnormal condition, wherein said different abnormality signals produced by said first and second abnormality signal generating means are generated from detecting signals sent from said first and second abnormal condition detecting means, respectively, each of the detection signals having substantially the same time duration;

wherein said first abnormality signal generating means comprises:
  a first elongating circuit connected to receive a first of said detection signals produced by said first abnormal condition detecting means and which produces a first signal having a time duration which is greater than the time duration of said first of said detection signals; and
  a first OR gate connected to receive, at a first input, a second of said detection signals and, at a second input, the first signal, and providing at an output said different abnormality signals, and wherein said second abnormality signal generating means comprises:
  a second elongating circuit connected to receive a third of said detection signals produced by said second abnormal condition detecting means and which produces a second signal having a time duration which is greater than the time duration of said third of said detection signals; and
  a third elongating circuit connected to receive a fourth of said detection signals produced by said second abnormal condition detecting means and which produces a third signal having a time duration which is greater than the time duration of said second signal; and
  a second OR gate connected to receive, at a first input, a fifth of said detection signals, at a second input, the second signal, and at a third input, the third signal, and providing at an output said different abnormality signals.

4. The semiconductor composite element according to claim 3, wherein:
  said first elongating circuit comprises a first resistor having a resistance R1 and a first capacitor having a capacitance C1, the first resistor and first capacitor being connected such that the time duration of said first signal is a function of the product R1·C1, and
  said second elongating circuit comprises a second resistor having a resistance R2 and a second capacitor having a capacitance C2, the second resistor and second capacitor being connected such that the time duration of said second signal is a function of the product R2·C2; and
  said third elongating circuit comprises a third resistor having a resistance R3 and a third capacitor having a capacitance C3, the third resistor and third capacitor being connected such that the time duration of said third signal is a function of the product R3·C3.

* * * * *